US008829958B2

(12) United States Patent
Asaduzzaman et al.

(10) Patent No.: US 8,829,958 B2
(45) Date of Patent: Sep. 9, 2014

(54) CLOCK AND DATA RECOVERY CIRCUITRY WITH AUTO-SPEED NEGOTIATION AND OTHER POSSIBLE FEATURES

(71) Applicant: Altera Corporation, San Jose, CA (US)

(72) Inventors: Kazi Asaduzzaman, Fremont, CA (US); Tim Tri Hoang, San Jose, CA (US); Tin H. Lai, San Jose, CA (US); Shou-Po Shih, Cupertino, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/693,363

(22) Filed: Dec. 4, 2012

(65) Prior Publication Data

US 2013/0093482 A1 Apr. 18, 2013

Related U.S. Application Data (62) Division of application No. 12/700,433, filed on Feb. 4, 2010.

(51) Int. Cl.
*H03L 7/06* (2006.01)
*H03L 7/081* (2006.01)
*H04L 7/033* (2006.01)
*H03L 7/08* (2006.01)

(52) U.S. Cl.
CPC ............... *H03L 7/08* (2013.01); *H03L 7/0814* (2013.01); *H04L 7/0337* (2013.01)
USPC ........... 327/157; 327/147; 327/156; 375/215; 375/294; 375/327; 375/373; 375/374; 375/375; 375/376

(58) Field of Classification Search
None
See application file for complete search history.

(56) References Cited

U.S. PATENT DOCUMENTS

| 5,512,860 | A | 4/1996 | Huscroft et al. |
| 5,684,434 | A | 11/1997 | Mann et al. |
| 5,689,195 | A | 11/1997 | Cliff et al. |
| 5,909,126 | A | 6/1999 | Cliff et al. |
| 6,075,416 | A | 6/2000 | Dalmia |
| 6,127,865 | A | 10/2000 | Jefferson et al. |
| 6,211,741 | B1 | 4/2001 | Dalmia |

(Continued)

FOREIGN PATENT DOCUMENTS

EP 1 104 113 5/2001

OTHER PUBLICATIONS

Ong et al., A 40-43-Gb/s Clock and Data Recovery IC With Integrated SFI-5 1:16 Demultiplexer in SiGe Technology, *IEEE Journal of Solid-State Circuits*, vol. 38, No. 12, Dec. 2003, pp. 2155-2168.

(Continued)

*Primary Examiner* — Adolf Dsouza
(74) *Attorney, Agent, or Firm* — Ropes & Gray LLP (57) ABSTRACT

An integrated circuit ("IC") may include clock and data recovery ("CDR") circuitry for recovering data information from an input serial data signal. The CDR circuitry may include a reference clock loop and a data loop. A retimed (recovered) data signal output by the CDR circuitry is monitored by other control circuitry on the IC for a communication change request contained in that signal. Responsive to such a request, the control circuitry can change an operating parameter of the CDR circuitry (e.g., a frequency division factor used in either of the above-mentioned loops). This can help the IC support communication protocols that employ autospeed negotiation.

7 Claims, 10 Drawing Sheets

(56) References Cited

U.S. PATENT DOCUMENTS

| | | |
|---|---|---|
| 6,215,326 B1 | 4/2001 | Jefferson et al. |
| 6,218,876 B1 | 4/2001 | Sung et al. |
| 6,236,697 B1 | 5/2001 | Fang |
| 6,272,646 B1 | 8/2001 | Rangasayee et al. |
| 6,407,576 B1 | 6/2002 | Ngai et al. |
| 6,462,594 B1 * | 10/2002 | Robinson et al. ............. 327/159 |
| 6,650,140 B2 | 11/2003 | Lee et al. |
| 6,687,320 B1 | 2/2004 | Chiu et al. |
| 6,856,180 B1 | 2/2005 | Starr et al. |
| 6,873,669 B2 | 3/2005 | Nakamura |
| 6,912,646 B1 | 6/2005 | Khu |
| 6,977,959 B2 | 12/2005 | Brunn et al. |
| 7,009,456 B2 | 3/2006 | Jasa et al. |
| 7,089,444 B1 | 8/2006 | Asaduzzaman et al. |
| 7,176,738 B1 | 2/2007 | Hwang et al. |
| 7,227,918 B2 | 6/2007 | Aung et al. |
| 7,265,634 B2 | 9/2007 | Miki |
| 7,366,271 B2 | 4/2008 | Kim et al. |
| 2005/0180536 A1 | 8/2005 | Payne et al. |
| 2008/0225933 A1 | 9/2008 | Chan et al. |
| 2008/0284524 A1 * | 11/2008 | Kushiyama ..................... 331/10 |
| 2009/0122939 A1 | 5/2009 | Hoang et al. |

OTHER PUBLICATIONS

Turner et al., *IEEE P802.3ae MDC/MDIO*, v1.0, Copenhagen, Denmark, Sep. 17-19, 2001, Slides 1-21.

* cited by examiner

FIG. 1

| ROW NO. | SPECIFICATION | REFCLK (MHz) | M | L (PFD) | L (PD) | FVCO (MHz) | FPLL (MHz) | DATA RATE (Mbps) |
|---|---|---|---|---|---|---|---|---|
| 1 | PCIE-GEN1 | 100 | 25 | 1 | 2 | 2500 | 1250 | 2500 |
| 2 | PCIE-GEN2 | 100 | 25 | 1 | 1 | 2500 | 2500 | 5000 |
| 3 | PCIE-GEN3 | 100 | 20 | 2 | 1 | 4000 | 4000 | 8000 |
| 4 | PCIE-GEN1 | 125 | 20 | 1 | 2 | 2500 | 1250 | 2500 |
| 5 | PCIE-GEN2 | 125 | 20 | 1 | 1 | 2500 | 2500 | 5000 |
| 6 | PCIE-GEN3 | 125 | 16 | 2 | 1 | 4000 | 4000 | 8000 |
| 7 | QPI (FAST) | 133.33 | 12 | 2 | 1 | 3200 | 3200 | 6400 |
| 8 | QPI (SLOW) | 133.33 | 12 | 2 | 2 | 3200 | 1600 | 3200 |

| PCIE_M | PCIE_L | CRU_L_PD | PD CLKOUT |
|---|---|---|---|
| 0 | 1 | 00 | DIV BY 2 (GEN 1) |
| 0 | 0 | 00 | BYPASS (GEN 2) |
| 1 | 1 | 00 | BYPASS (GEN 3) |
| DC | DC | 01 | DIV BY 2 |
| DC | DC | 10 | DIV BY 4 |
| DC | DC | 11 | DIV BY 8 |

FIG. 4

| PCIE_M | PCIE_L | CRU_L_PFD | PFD CLKOUT |
|---|---|---|---|
| 0 | 1 | 00 | BYPASS (GEN 1) |
| 0 | 0 | 00 | BYPASS (GEN 2) |
| 1 | 1 | 00 | DIV BY 2 (GEN 3) |
| DC | DC | 01 | DIV BY 2 |
| DC | DC | 10 | DIV BY 4 |
| DC | DC | 11 | DIV BY 8 |

| CRAM SETTING | RESULTING $I_{CP}$ |
|---|---|
| 000 | 40 μA ("NOMINAL") |
| 001 | 2 * NOMINAL |
| 010 | 4 * NOMINAL |
| 011 | 5 * NOMINAL |
| 100 | 6 * NOMINAL |
| 101 | 8 * NOMINAL |
| 110 | 10 * NOMINAL |

FIG. 10

| DATA RATE (Gbps) | VCO RANGE (GHz) (INCLUDES EFFECT OF L COUNTER SETTING) | L COUNTER SETTING |
|---|---|---|
| 12.5 - 6 | 6.25 - 3 | 1 |
| 6 - 3 | 3 - 1.5 | 2 |
| 3 - 1.5 | 1.5 - 0.75 | 4 |
| 1.5 - 0.622 | 0.75 - 0.5 | 8 |

| CRAM SETTING | CONTROLLABLY VARIABLE REGULATOR OUTPUT VOLTAGE |
|---|---|
| 000 | 1.8V ("NOMINAL") |
| 001 | NOMINAL + 5% BOOST |
| 010 | NOMINAL + 10% BOOST |
| 011 | NOMINAL + 15% BOOST |
| 100 | NOMINAL + 20% BOOST |
| 101 | NOMINAL + 30% BOOST |
| 110 | NOMINAL + 40% BOOST |
| 111 | NOMINAL + 50% BOOST |

FIG. 13

CLOCK AND DATA RECOVERY CIRCUITRY WITH AUTO-SPEED NEGOTIATION AND OTHER POSSIBLE FEATURES

CROSS REFERENCE TO RELATED APPLICATION

This is a division of copending, commonly-assigned U.S. patent application Ser. No. 12/700,433, filed Feb. 4, 2010, which is hereby incorporated by reference herein in its entirety.

BACKGROUND

This invention relates, inter alia, to clock and data recovery ("CDR") circuitry, especially CDR circuitry that may be included on an integrated circuit ("IC") device. Illustrative ICs that may employ the invention include programmable (or configurable) ICs such as programmable logic-devices ("PLDs"), field-programmable gate arrays ("FPGAs"), programmable microcontrollers, and the like.

An important block in transceiver circuitry is the CDR circuit that resides in the receiver portion of the transceiver. CDR is used to extract high-speed clock information and high-speed data information from a received high-speed serial data signal. For example, the transceiver may be on one IC in a larger system, and the high-speed serial data signal may be received by that IC from another IC in the system.

The CDR uses a reference clock signal at a particular frequency (having a known relationship to the nominal frequency, bit rate, or data rate of the high-speed serial data signal) to initially train its frequency. (Although the reference clock signal has a known frequency relationship to the high-speed serial data signal, there is typically no required phase relationship between these two signals.)

After the above initial frequency training, the CDR then uses the data stream (in the high-speed serial data signal) to frequency-and-phase align the CDR with the data. Such frequency and phase alignment allows the CDR to output a recovered clock signal having phase and frequency that are suitable for recovering (and possibly also further processing) data information from the high-speed serial data signal. (The recovered data may be contained in a so-called retimed data signal.)

CDR circuitry may be required for inclusion in relatively general-purpose devices. For example, ICs like PLDs, FPGAs, programmable microcontrollers, and the like may be designed for use in any of a wide range of applications. The manufacturer of the IC does not know all the specifics of all the uses to which various users of the IC may wish to put the IC in larger systems being built by such users. It is desirable for the IC manufacturer to be able to provide an IC product that can meet the requirements of a wide range of uses, because this increases sales volume of the IC (which can help to lower unit cost of the IC). In such contexts, it can be desirable for the CDR circuitry to be able to support any of many high-speed serial data communication (signalling) protocols, standards, or specifications. Each of these protocols requires the CDR to extract data and clock signal information from a data stream running at a particular frequency.

An example of a high-speed serial interface ("HSSI") protocol that is fairly widely used is so-called Peripheral Component Interface Express ("PCIE"). There are three different PCIE standards: Gen1, Gen2, and Gen3. These standards require data running at 2.5 Gigabits per second ("Gbps"), 5.0 Gbps, and 8.0 Gbps, respectively. In general, PCIE can include so-called auto-speed negotiation among these three speed standards. This means that a transmitter may signal that it wishes to communicate at a particular one of these speeds, and the receiver must respond by switching to that speed (assuming that the receiver can operate at that speed). A desirable attribute of CDR circuitry (especially in general-purpose circuitry of the various kinds that are mentioned above) is the ability to support auto-speed negotiation such as is characteristic of PCIE. (Auto-speed negotiation is also sometimes referred to as auto-negotiation.) CDR circuitry is also desired that can operate at any frequency in a wide band of data rates (frequencies) in order to support any of a large number of different HSSI protocols.

SUMMARY

In accordance with certain possible aspects of the invention, an integrated circuit ("IC") may include clock and data recovery ("CDR") circuitry for recovering clock and data information from an input serial data signal. The CDR circuitry may include a circuit element that is controllable by a control signal to perform in any of a plurality of different ways. For example, the circuit element may be able to scale (e.g., multiply or divide) the frequency of a signal in the CDR circuitry by any selectable one of a plurality of different scale factors. The control signal may affect (i.e., at least partially control the selection of) the scale factor that the circuit element employs at any given time. Other control circuitry on the IC may monitor the data information that the CDR circuitry recovers from the input serial data signal in order to detect occurrence of a communication change request in the recovered data information. The control circuitry may respond to such a change request by changing the above-mentioned control signal to change how the CDR circuitry operates.

In accordance with certain other possible aspects of the invention, an IC may include CDR circuitry and control circuitry. The CDR circuitry may include a reference clock loop and a data loop. Each of these loops may include respective frequency scaling circuitry for scaling (multiplying or dividing) the frequency of a signal recirculating (feeding back) in the respective loop. The scale factor employed in each loop may be selectable at least partly independently of the scale factor selection made in the other loop. The above-mentioned control circuitry may provide at least partly separate control signals for controlling the scale factor selection made and employed in each loop. The control circuitry may base production of these control signals at least in part on communication change requests that occur in the data information the CDR circuitry recovers from the input serial data signal on which the CDR circuitry operates.

In accordance with certain still other possible aspects of the invention, an IC may include phase-locked loop ("PLL") circuitry, which in turn includes charge pump circuitry, voltage-controlled oscillator circuitry, and phase-frequency detector circuitry coupled to one another in a closed loop series. The IC may further include circuitry for supplying a controllably variable amount of charge pump current to the charge pump circuitry.

In accordance with still further possible aspects of the invention, an integrated circuit may include phase-locked loop circuitry, which in turn includes charge pump circuitry, voltage-controlled oscillator coupled, and phase-frequency detector circuitry coupled to one another in a closed loop series. The IC may further include controllably variable voltage regulator circuitry for applying a regulated voltage to the charge pump circuitry, the regulated voltage being controllably variable.

Further features of the invention, its nature and various advantages will be more apparent from the accompanying drawings and the following detailed description.

DETAILED DESCRIPTION

Illustrative CDR and related circuitry in accordance with this invention can support features such as the following: (1) a 10 GHz voltage-controlled oscillator ("VCO") with very low jitter and a wide tuning range; (2) high bandwidth options with high charge pump current setting; (3) PCIE switch for auto-speed negotiation; (4) the ability to support the Intel Corporation standard known as Quick Path Interconnect ("QPI"); (5) multi-level power supply support (e.g., for (a) high-speed such as 10 Gbps, which requires high VCC (such as 1.0V), high VCCEH (such as 3.0V), and high current, or (b) low-speed such as 6 Gbps, which can be supported by low VCC (such as 0.77V or 0.85V), low VCCEH (such as 2.5V), and low current; and (6) controllable (e.g., programmable) charge pump regulator to support the above two speed grades. (Typically VCC is the general power supply for the IC, especially the digital part of the circuitry on the IC; while VCCEH may be the power supply voltage for certain analog circuitry on the IC (e.g., for voltage regulators that serve other circuitry on the IC).)

Illustrative CDR and related circuitry in accordance with this invention can provide continuous multi-rate operation from 622 Mega-bits per second (Mbps) to 12.5 Gbps in the data rate of a received high-speed serial data signal. Such illustrative circuitry uses a reference clock signal having a frequency between about 50 MHz and 644 MHz to train the CDR frequency. The VCO operates at half the data rate, and has a single "gear" of operation. The VCO supports a continuous tuning range from about 1 GHz to about 6.25 GHz. Controllable scalers (e.g., dividers) downstream from the VCO extend the CDR's data range. Illustrative divider settings are 1, 2, 4, and 8. A second controllable scaler (e.g., divider) is provided in the CDR's phase-frequency detector feedback loop (or reference clock loop). Illustrative settings for this second divider are 1, 4, 5, 8, 10, 12, 16, 20, and 25. Various combinations of the selections available from these two scalers can make longer lists of options (e.g., overall division by 1, 4, 5, 8, 10, 12, 16, 20, 25, 32, or 40) available to a user of the IC.

Illustrative CDR and related circuitry in accordance with this invention can support options for PCIE Gen2 auto-negotiation and PCIE Gen3 auto-negotiation. The data loop (i.e., the phase detector ("PD") loop) can change from 5 Gbps to 2.5 Gbps and vice-versa dynamically for PCIE Gen2 auto-speed negotiation. For PCIE Gen3 auto-speed negotiation, the data loop can change from 8 Gbps to 5 Gbps and vice-versa dynamically. PCIE Gen1 data rate to PCIE Gen3 and vice-versa are also possible dynamically. These auto-negotiation capabilities avoid any need to reprogram the CDR, reset it, and bring it back to lock to the received ("RX") signal.

Figure 1:
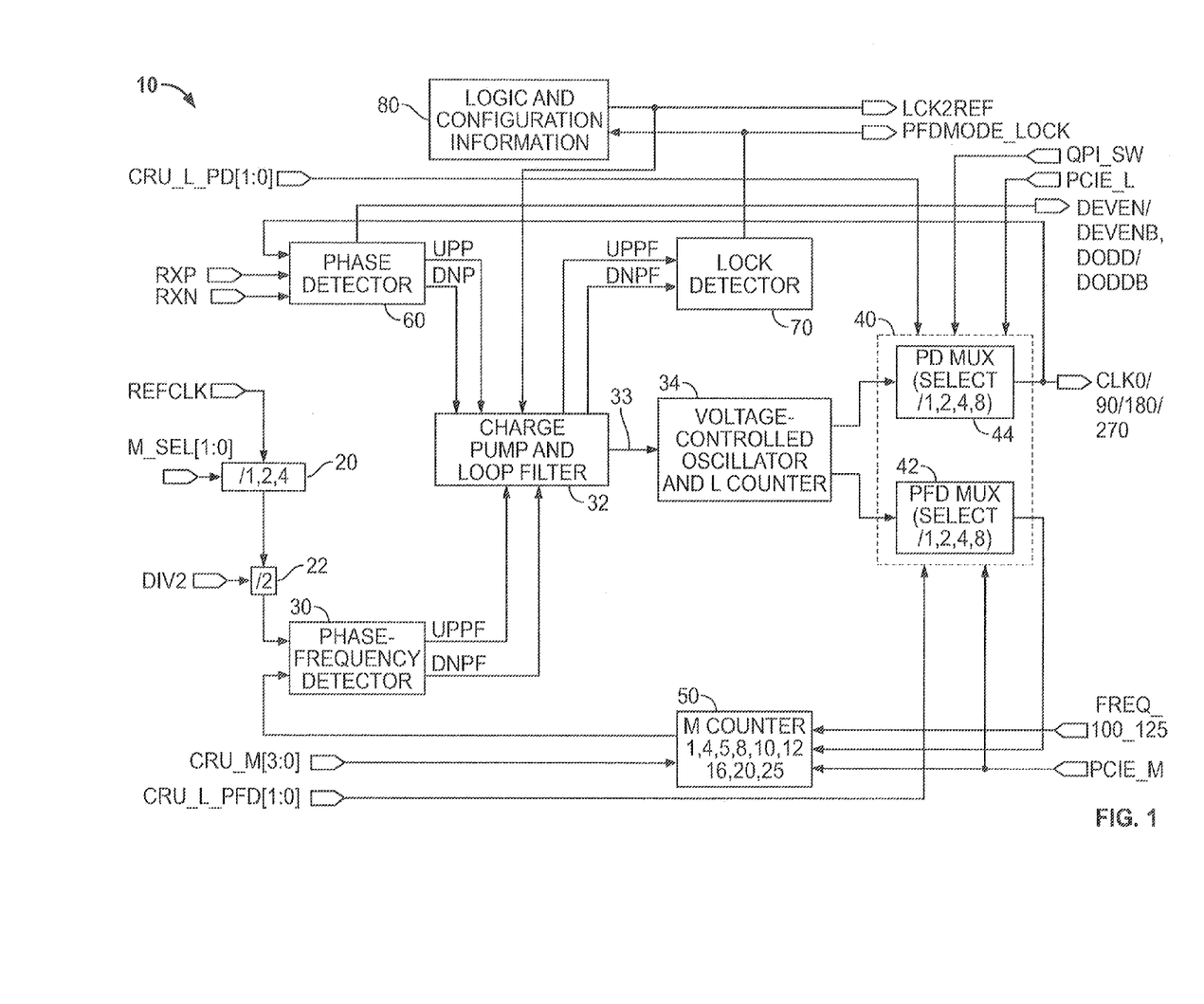
FIG. 1 is a simplified schematic block diagram of an illustrative embodiment of circuitry in accordance with certain possible aspects of the invention.

An illustrative embodiment of CDR circuitry 10 is accordance with certain possible aspects of the invention is shown in FIG. 1. CDR circuitry 10 includes two loops. One of these loops (sometimes referred to as the reference clock loop) includes phase-frequency detector ("PFD") 30, charge pump ("CP") and loop filter ("LF") 32, voltage-controlled oscillator ("VCO") and L counter 34, PFD multiplexer ("Mux") 42, and M counter 50 coupled to one another in a closed loop series in the order in which they have been mentioned. ("L" and "M" are just arbitrary designations employed to facilitate the discussion herein.) CDR circuitry 10 uses this reference clock loop to train its frequency using a reference clock signal REFCLK. When VCO 34 has settled into an oscillating frequency that has a desired relationship to the frequency of REFCLK, CDR circuitry 10 automatically advances to use of its other loop (sometimes referred to as the data loop), which includes phase detector ("PD") 60, CP and LF 32, VCO and L counter 34, and PD mux 44 coupled to one another in a closed loop series in the order in which they have been mentioned. Use of the data loop allows CDR circuitry 10 to recover clock (CLK0/90/180/270) and data (DEVEN/DEVENB, DODD/DODDB) information from the received high-speed serial data signal (RXP/RXN).

Considering the above-described elements of FIG. 1 now in more detail, the reference clock signal REFCLK (e.g., from a source external to the IC that includes CDR circuitry 10) is applied to frequency scaler (e.g., divider) circuitry 20. This circuitry can scale (e.g., divide) the frequency of the REFLCLK signal by a controllable (selectable) frequency scale factor. In the illustrative embodiment shown in FIG. 1, the available choices for this factor are 1 (no actual frequency division), 2, and 4. The factor actually selected and employed by circuitry 20 is controlled by the values (logical states) of the M_SEL[1:0] selection control signals. In cases in which CDR circuitry 10 is included on a programmable IC (such as a PLD or other type of programmable IC mentioned earlier in this specification), the M_SEL signals may come from programmable, device-configuring memory of the IC. (Such memory may sometimes be referred to as configuration random-access memory ("CRAM").) Typical use of such a programmable IC includes an initial configuration (or reconfiguration) phase, during which desired values are programmed into the CRAM. These CRAM values give the IC a particular set of operating characteristics for subsequent user-mode or normal operating mode operation of the IC. The M_SEL signals are an example of such CRAM control signals (i.e., that are initially programmed into the IC, and that thereafter control normal, user-mode operation of the IC).

The reference clock signal output by frequency scaler (e.g., divider) circuitry 20 is applied to further frequency scaler (e.g., divider) circuitry 22. This latter circuitry optionally divides the reference clock signal by a further factor of 2, depending on the logical state of the DIV2 control signal. The DIV2 signal can be another selectable (e.g., programmably determined) signal (like above-described signals M_SEL[1:0]).

Circuit elements 20 and 22 are REFCLK signal prescalers that (for example) allow the frequency of the REFCLK signal to be reduced if, as applied to the IC, the REFCLK frequency is too high.

The reference clock signal output by circuitry 22 is applied to one of the two inputs to phase-frequency detector ("PFD") 30. The other input to PFD 30 is a signal fed back from the reference clock loop of CDR 10 as described earlier (and also below). PFD 30 compares the phase and frequency of the two signals applied to it. If PFD 30 detects that the frequency of the feedback signal needs to increase to produce a better phase and frequency match with the reference clock signal from element 22, PFD 30 outputs an "UP" pulse on its UPPF output lead. On the other hand, if PFD 30 detects that the frequency of the feedback signal needs to decrease to produce a better phase and frequency match with the reference clock signal from element 22, PFD 30 outputs a "DOWN" pulse on its DNPF output lead.

Charge pump ("CP") and loop filter ("LF") 32 receives the above-mentioned output signals of PFD 30. The loop filter portion of circuitry 32 acts as an integrator of the UP and DOWN pulses it receives. For example, the loop filter circuitry may operate like analog low-pass filter circuitry such that when the occurrence of UP pulses is significantly greater (more frequent) than the occurrence of DOWN pulses, the loop filter causes the charge pump portion of circuitry 32 to change the output 33 of element 32 in the manner appropriate to cause the frequency of oscillation of the VCO portion of circuitry 34 to increase. Conversely, when the occurrence of DOWN pulses is significantly greater (more frequent) than the occurrence of UP pulses, the loop filter causes the charge pump portion of circuitry 32 to change output 33 in the manner appropriate to cause the VCO frequency to decrease. The responsiveness of the above-mentioned filtering determines the responsiveness and degree of stability of the reference clock loop. As will be further explained later, different filter values may be used, depending on whether element 32 is operating in the reference clock loop or in the data loop.

The VCO portion of element 34 includes (as its name implies) a voltage-controlled oscillator. As discussed above, the frequency of oscillation of this VCO is controlled (within the controllable operating frequency range of the VCO) by the output signal 33 of element 32. The oscillatory signal output by the VCO is subjected (by the L counter portion of circuitry 34) to parallel frequency scaling (e.g., division) by four different scale factors: 1 (no actual frequency division), 2, 4, and 8. In other words, the L counter portion of circuitry 34 produces output signals having (1) the VCO output signal frequency, (2) the VCO output signal frequency divided by 2, (3) the VCO output signal frequency divided by 4, and (4) the VCO output signal frequency divided by 8. PFD mux circuitry 42 is controllable to select (and output) any one of these four differently-scaled signals.

Control of the selection made by PFD mux 42 (and also the (possibly different) selection made by PD mux 44) will now be further discussed. FIG. 1 shows PFD mux 42 and PD mux 44 as parts of a subcircuit 40 that receives selection control signals CRU_L_PFD[1:0], CRU_L_PD[1:0], PCIE_L, PCIE_M, and QPI_SW. These signals can be used in various combinations to control the selection made by each of muxes 42 and 44. For example, the CRU_L_PFD[1:0] signals can be programmable signals (e.g., from CRAM as described earlier for certain other configuration control signals like M_SEL[1:0] and DIV2) for at least partly controlling the selection made by mux 42. CRU_L_PD[1:0] can be similar programmable signals (e.g., from CRAM) for at least partly controlling the selection made by mux 44.

On the other hand, PCIE_L and PCIE_M are preferably more dynamic signals that are subject to change during normal or user-mode operation of the IC to support PCIE auto-speed negotiation. Assuming, for example, that in addition to including CDR 10, the IC includes "core" or other signal processing circuitry (not shown in FIG. 1, but shown at 120 in FIG. 3) that receives and processes data recovered by CDR circuitry 10, then PCIE_L and PCIE_M may be relatively dynamic (time-varying) signals that are produced (typically at least to some extent) based on certain of the recovered data. Thus, although PCIE_L and PCIE_M may come from some memory or registers in the above-mentioned core circuitry, those signal storage elements are preferably not the more static CRAM, but rather are elements whose contents can be modified more dynamically in the course of normal or user-mode operation of the IC. QPI_SW is another signal of the general type described above for PCIE_L and PCIE_M. This signal is used to help support options that are part of the QPI communication protocol. This will be further discussed later in this specification.

The output of mux 42 is applied to M counter circuitry 50. This circuitry can scale (e.g., divide) the frequency of its input (from mux 42) by any one of factors 1, 4, 5, 8, 10, 12, 16, 20, or 25. Several signals are applied to circuitry 50 to control the frequency division factor selected by that circuitry for use. These selection control signals include CRU_M[3:0], PCIE_M, and FREQ_100_125. CRU_M[3:0] and FREQ_100_125 are typically programmable selection control signals (e.g., from CRAM) (like earlier-described signals CRU_L_PFD(1:0), for example). PCIE_M is (again) one of the more dynamic signals that was described in an earlier paragraph.

The output signal of circuitry 50 is fed back to PFD 30 to complete the reference clock loop.

Stability of the reference clock loop is monitored by lock detector circuitry 70, which also receives the earlier-mentioned UPPF and DNPF signal pulses. For example, when the frequency of occurrence of UPPF and DNPF signal pulses becomes approximately the same for a sufficiently long period of time, this can be detected by circuitry 70, which can then output a PFDMODE_LOCK signal indicating that VCO 34 is now oscillating at a frequency that is appropriate for use in the data loop (e.g., to recover data information from high-speed serial data input signal RXP/RXN).

Among other possible uses, the PFDMODE_LOCK signal is applied to logic and configuration information circuitry 80. After a short delay following assertion of the PDFMODE_LOCK signal, circuitry 80 may assert its LCK2REF output signal. Among other possible uses, the LCK2REF signal is applied to CP and LF circuitry 32. That circuitry can respond to the LCK2REF signal by causing CDR 10 to switch from using its reference clock loop to using its data loop. For example, this may mean that CP and LF circuitry 32 no longer responds to the UPPF and DNPF signals from PFD 30 and instead responds (in a generally similar way) to the UPP and DNP signals from PD 60. Circuitry 32 may also respond to assertion of LCK2REF by changing the filter parameters used by the LF portion of that circuitry. Such a change in LF operating parameters may be made to increase how strongly the number or occurrence of UP pulses must predominate over DOWN pulses (or vice versa) in order for circuitry 32 to produce a given amount of change in the oscillating frequency of VCO 34. The resulting greater stability of the data loop may be desirable for greater stability of the recovered clock, etc.

Turning now to more detailed consideration of the data loop, mux circuitry 44 is an element of that loop. Mux circuitry 44 has already been largely described, especially with regard to how the frequency division factor selection it makes is controlled. Here it is further noted that, regardless of the frequency division factor selected, mux circuitry 44 preferably always outputs four signals that have a common frequency, but phases that are equally spaced from one another by 90 degrees. Thus if one of the outputs of circuitry 44 is assumed to have a phase of 0 degrees relative to phase of the received serial data signal RXP/RXN, the three other outputs of circuitry 44 have phases of 90 degrees, 180 degrees, and 270 degrees, respectively, relative to RXP/RXN. These four signals may sometimes be referred to as CLK0, CLK90, CLK180, and CLK270. These signals are applied to PD 60 to close the data loop. They can also be output from CDR 10 as so-called recovered clocks of the CDR.

As noted earlier, PD 60 compares phase of the outputs of mux 44 to phase of the received high-speed serial data signal RXP/RXN. PD 60 produces UPP or DNP pulses to indicate whether the frequency of VCO 34 should increase or decrease to cause phase of the mux 44 outputs to better match phase of RXP/RXN. These UPP and DNP pulses are applied to CP and LF 32, which uses these pulses similarly to the earlier-described use of pulses UPPF and DNPF. Thus CP and LF 32 continues to influence the frequency of VCO 34 to keep outputs of circuitry 34 and 44 synchronized or aligned in phase with RXP/RXN.

PD 60 also uses outputs of mux 44 to sample RXP/RXN at times that are appropriate for recovering each successive bit of data information from RXP/RXN. The resulting recovered or retimed data is output as two pairs of complementary signals (i.e., DEVEN and DEVENB for the data bit in each successive "even" bit position in the serial input data signal RXP/RXN, and DODD and DODDB for the data bit in each successive "odd" bit position in RXP/RXN). It will be noted from this discussion that CDR 10 effectively outputs the two bits in each successive pair of bits (one "even" and one "odd") in parallel. This gives CDR 10 a so-called half-rate architecture, which enables it to recover data from a serial data signal whose bit rate is twice the frequency of oscillation of VCO 34. As just one example of this (which was mentioned earlier), CDR 10 can oscillate at 6.25 GHz to recover data from a data signal RXP/RXN having a 12.5 Gbps data rate.

To complete the discussion of the data loop, VCO and L counter circuitry 34 continues to operate under the control of CP and LF circuitry 32, and now the operative L counter output selection is made by mux 44 (not mux 42).

Figure 2:
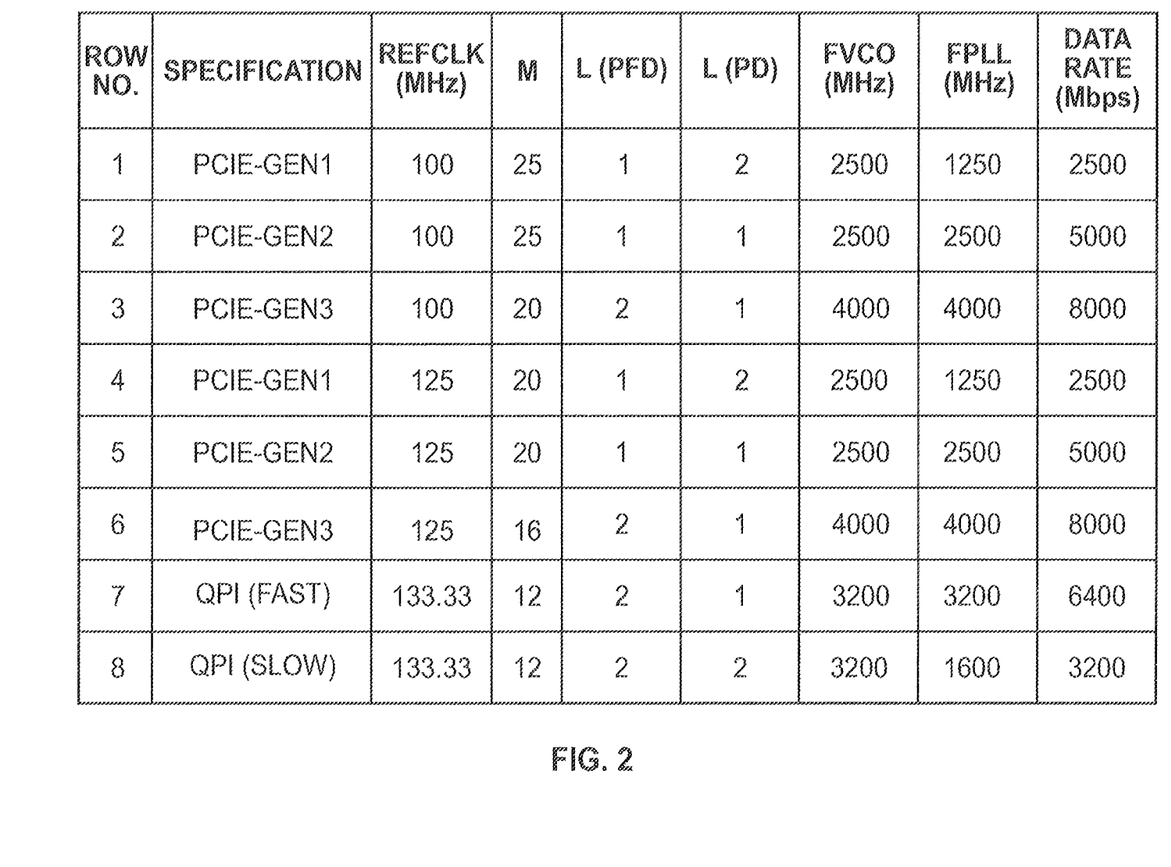
FIG. 2 is a chart showing illustrative values for several circuit operating parameters for use in supporting several illustrative serial data signal communication protocols in accordance with certain possible aspects of the invention.

FIG. 2 shows just some examples of the many communication protocols that CDR 10 can support, and how various parts of the CDR are controlled to operate in order to support those protocols. The FIG. 2 column with the heading "Specification" identifies the communication protocols covered by FIG. 2. Each row in FIG. 2 specifies various CDR 10 operating parameters that are used to support the protocol identified in that row. PCIE can operate with a REFCLK signal (as actually applied to PFD 30) having a frequency of either 100 MHz (rows 1-3 in FIG. 2) or 125 MHz (rows 4-6 in FIG. 2). Upstream from elements 20 and 22 the original REFCLK signal frequency may be higher. But if so, then elements 20/22 are used to divide that frequency down to either 100 MHz or 125 MHz.

As noted earlier, the data rate for PCIE Gen1 (row 1 or 4 in FIG. 2) is 2.5 Gbps (right-hand column in FIG. 2). To support PCIE Gen1 with REFCLK at 100 MHz (row 1 in FIG. 2), M counter 50 is set to divide by 25, mux 42 is controlled to select the divided-by-1 output of L counter 34, mux 44 is controlled to select the divided-by-2 output of L counter 34, the resulting frequency of VCO 34 (the FVCO column in FIG. 2) is 2500 MHz, and the recovered clock signal frequency (FPLL column in FIG. 2, and frequency of the CLK0/CLK90/CLK180/CLK270 signals) is 1250 MHz. This is all shown in row 1 of FIG. 2.

To support PCIE Gen1 with REFCLK at 125 MHz (row 4 in FIG. 2), M counter 50 is set to divide frequency by 20, but the rest of the CDR 10 operating parameters are the same as in row 1.

To support PCIE Gen2 with REFCLK at 100 MHz (row 2 in FIG. 2), M counter 50 is set to divide frequency by 25, both of muxes 42 and 44 are controlled to select the divided-by-1 output of L counter 34, VCO 34 oscillates at 2500 MHz, the recovered clock signal frequency is also 2500 MHz, and the supported RXP/RXN serial data rate is 5000 Mbps.

To support PCIE Gen2 with REFCLK at 125 MHz (row 5 in FIG. 2), M counter 50 is set to divide frequency by 20, but the rest of the CDR 10 operating parameters are the same as in row 2.

To support PCIE Gen3 with REFCLK at 100 MHz (row 3 in FIG. 2), M counter 50 is set to divide frequency by 20, mux 42 is controlled to select the divided-by-2 output of L counter 34, mux 44 is controlled to select the divided-by-1 output of L counter 34, VCO 34 oscillates at 4000 MHz, the recovered clock signal frequency is 4000 MHz, and the supported RXP/RXN serial data rate is 8000 Mbps.

To support PCIE Gen3 with REFCLK at 125 MHz (row 6 in FIG. 2), M counter 50 is set to divide frequency by 16, but the rest of the CDR 10 operating parameters are the same as in row 3.

Turning now to QPI, this standard has two options: (1) a serial data rate (RXP/RXN) of 6400 MHz, or (2) a serial data rate (RXP/RXN) of 3200 MHz. Both cases employ a REFCLK signal frequency (after any frequency division by elements 20/22) of 133.33 MHz. Both options use an M counter 50 frequency division factor of 12, and a mux 42 selection of the divided-by-2 output of L counter 34. However, the 6400 Mbps option uses the divided-by-1 selection of mux 44, while the 3200 Mbps option uses the divided-by-2 selection of that mux. In both options, the frequency of VCO 34 ("FVCO") is 3200 MHz. With the 6400 Mbps option, the recovered clock signal frequency ("FPLL" (or frequency of phase-locked loop)) is 3200 MHz; while with the 3200 Mbps option, the recovered clock signal frequency is 1600 MHz.

Figure 3:
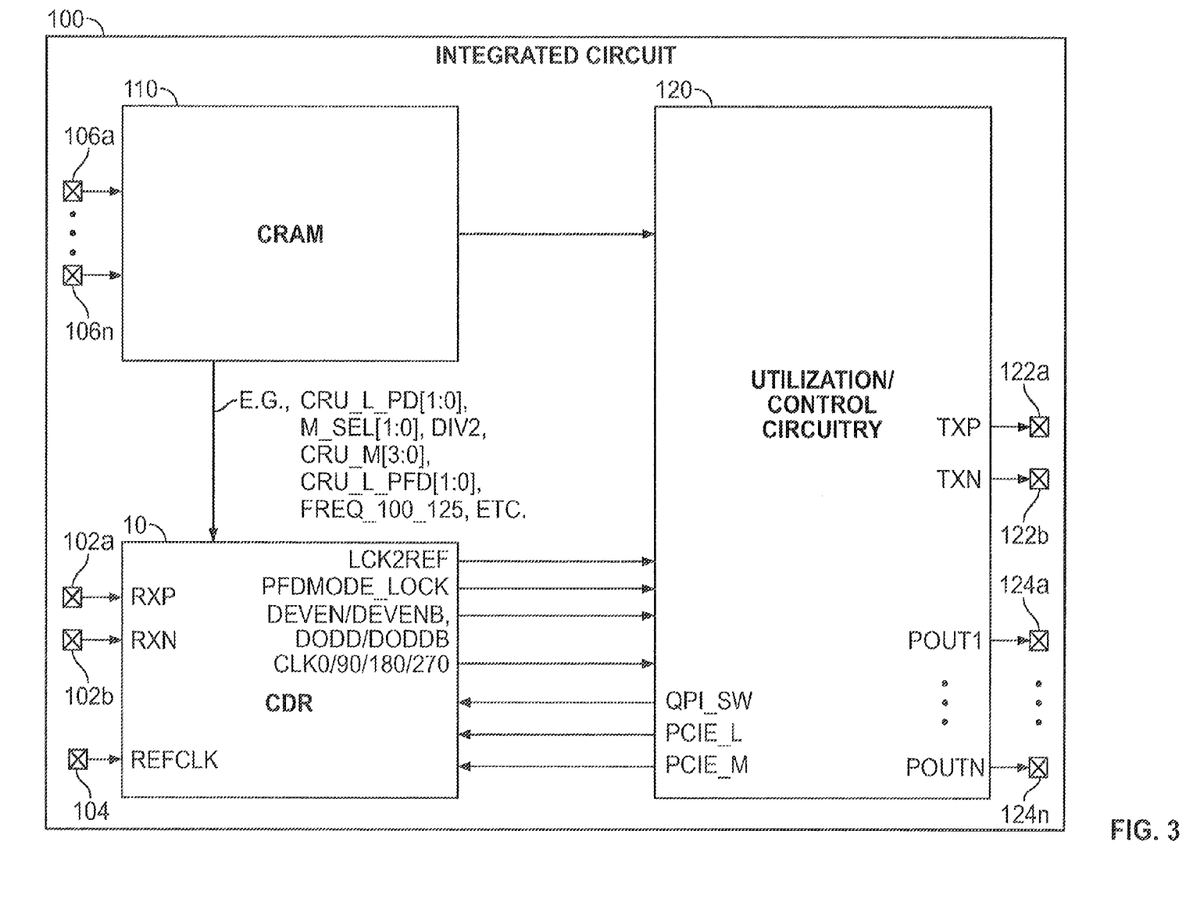
FIG. 3 is a simplified schematic block diagram of an illustrative embodiment of more extensive circuitry in accordance with certain possible aspects of the invention.

FIG. 3 shows further aspects of how CDR 10 can be controlled to support the various communication protocols illustrated by FIG. 2 (or other protocols of similarly various kinds). FIG. 3 shows that CDR 10 is typically part of the circuitry of an IC 100. Configuration random-access memory ("CRAM") 110 as mentioned at several places earlier in this specification may also be included on IC 100. IC 100 may also include so-called utilization circuitry 120 (which may also be referred to by other names such as core circuitry, programmable core circuitry, programmable logic circuitry, etc., depending on the type of device that IC 100 is).

Assuming that IC 100 has the construction shown in FIG. 3, signals like RXP, RXN, and REFCLK may be applied to input pins, terminals, or pads 102/104 of IC 100 from external sources such as one or more other ICs in a larger system that includes IC 100. Signals for initially programming or configuring (or reprogramming or reconfiguring) IC 100 (especially the CRAM 110 of IC 100) may be applied to one or more other input pins 106 of the IC. After having thus been programmed, CRAM 110 outputs control signals having particular values for causing CDR 10 (and possibly also one or more aspects of utilization circuitry 120) to operate in particular ways. Examples of such control signals that CRAM 110 outputs to CDR 10 are above-described signals CRU_L_PD[1:0], M_SEL[1:0], DIV2, CRU_M[3:0], CRU_L_PFD[1:0], FREQ_100_125, etc. As has been said earlier in this specification, these signals from CRAM 110 are static (i.e., constant over time) or at least relatively static (i.e., subject to change only relatively infrequently) because they are initially set when IC 100 is first programmed, and they can be changed (if at all) only by reprogramming the IC, which is typically not done very often (if it can be done at all, depending on the type of device that IC 10 is).

FIG. 3 further shows that the earlier-described output signals of CDR 10 are typically applied to utilization circuitry 120. Examples of such CDR 10 output signals are LCK2REF, PFDMODE_LOCK, DEVEN, DEVENB, DODD, DODDB, CLK0, CLK90, CLK180, CLK270, etc. These are, of course, dynamic (i.e., time-varying) or at least relatively dynamic signals (e.g., as compared, for the most part, to the earlier-mentioned output signals of CRAM 110). Utilization circuitry 120 makes "user mode" use of these signals in any of various ways, depending on what the user desires IC 100 to do. For example, utilization circuitry 120 may process the retimed data (DEVEN, etc.) output by CDR 10 in any of several ways (possibly in combination with other signals that are input to IC 100), e.g., to produce further serial output signals TXP/TXN and/or parallel output signals POUT1-POUTN, which can be respectively output from IC 100 via serial output pins 122a/b or parallel output pins 124a-n.

FIG. 3 still further shows that utilization circuitry 120 applies to CDR 10 additional signals for controlling certain aspects of the operation of the CDR. For example, these further CDR 10 control signals can include PCIE_L, PCIE_M, QPI_SW, etc. These signals are also appropriately characterized as dynamic (i.e., time-varying or possibly time-varying) because their values can change during normal or user-mode operation of IC 100. It is not typical for these signals to change extremely rapidly or frequently, but they can change more easily and more rapidly than the more static output signals of CRAM 110. Moreover, as will be further elaborated below, they can be changed without any need to reprogram or reconfigure IC 100 or its CRAM 110).

Among the processing, e.g., of retimed data DEVEN, etc., that utilization circuitry 120 may perform is to extract from the retimed data PCIE auto-speed negotiation commands or other information. For example, CDR 10 may be initially engaged in PCIE Gen1 communication, and some of the serial data signals RXP/RXN receives as part of that communication may indicate that the transmitter of that data would like to change to faster PCIE Gen2 (or still faster PCIE Gen3) communication. Utilization circuitry 120 detects the presence (in the retimed data DEVEN, etc., from CDR 10) of such a PCIE auto-speed negotiation change request. Utilization circuitry 120 responds to such a request by changing the value(s) of one or both of the PCIE_L and PCIE_M signals in the manner required to cause CDR 10 to switch to the requested new PCIE sub-protocol (e.g., from PCIE Gen1 to PCIE Gen2 or PCIE Gen3, depending on the change requested).

More specifically, if the circuitry is initially performing PCIE Gen1, and the auto-speed negotiation change requested is to PCIE Gen2, utilization circuitry 120 does not have to change the state of the PCIE_M signal (used to control (in part) (1) which frequency division factor M counter 50 uses, and (2) which L counter 34 output mux 42 selects (because M and L(PFD) are the same for Gen1 and Gen2 in FIG. 2)). However, utilization circuitry 120 does need to change the state of the PCIE_L signal, because that signal is used to control (in part) which L counter 34 output mux 44 selects (since L(PD) is different for Gen1 and Gen2 in FIG. 2).

As another example, if the request is for a change from Gen1 to Gen3, then utilization circuitry 120 changes the state of both PCIE_L (a control for L(PD) in FIG. 2) and PCIE_M (a control for M and L(PFD) in FIG. 2) because all of these CDR 10 operating parameters need to change to switch CDR 10 from Gen1 to Gen3.

All other combinations/directions of PCIE Gen change are also possible (i.e., Gen2 to Gen3, Gen2 to Gen1, Gen3 to Gen1, and Gen3 to Gen2). In each case, utilization circuitry 120 detects the change requested as part of the retimed data DEVEN, etc., and then makes any appropriate change in the state of PCIE_L and/or PCIE_M. CDR 10 responds to such change(s) to its control signals by switching to the requested new operating mode as shown in the corresponding horizontal line or row of parameter values in FIG. 2. The circuitry can thus automatically and dynamically respond to any PCIE auto-speed negotiation change request. It is not necessary to reprogram IC 100 or its CRAM 110 to cause the IC and its CDR 10 to switch from any PCIE Gen to any other PCIE Gen. Changes between PCIE Gen1 and PCIE Gen2 can be effected without a need to return CDR 10 to use of its reference clock loop. However, changes between PCIE Gen1 and PCIE Gen3, and between PCIE Gen2 and PCIE Gen3 may require CDR 10 to briefly return to use of its reference clock loop.

In QPI, utilization circuitry 120 can operate similarly to control the QPI_SW signal to respond to auto-speed negotiation change requests between the two forms of QPI shown in rows 7 and 8 in FIG. 2. For this purpose the QPI_SW signal is like the PCIE_L signal, in that it controls (in part) the L counter 34 output selection made by mux 44.

Figure 4:
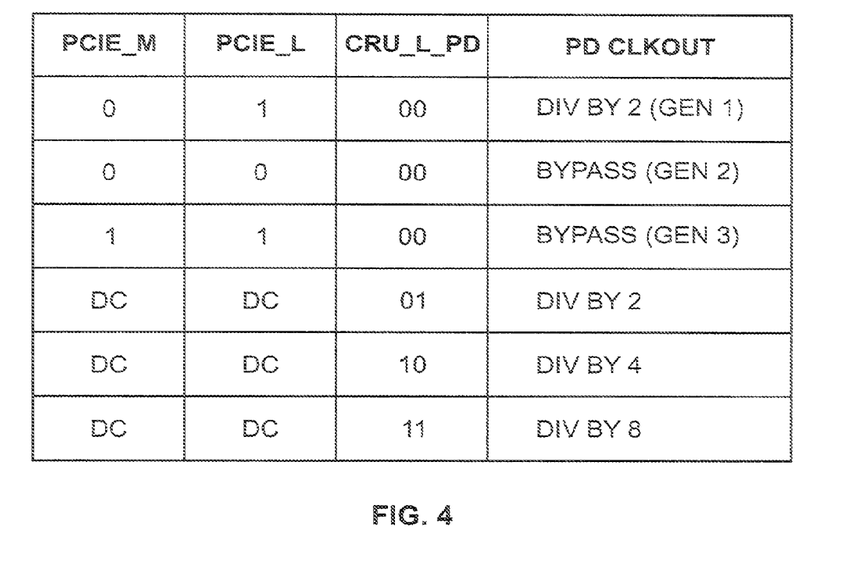
FIG. 4 is a chart showing illustrative values for several control signals under various illustrative operating conditions of circuitry in accordance with certain possible aspects of the invention.
Figure 5:
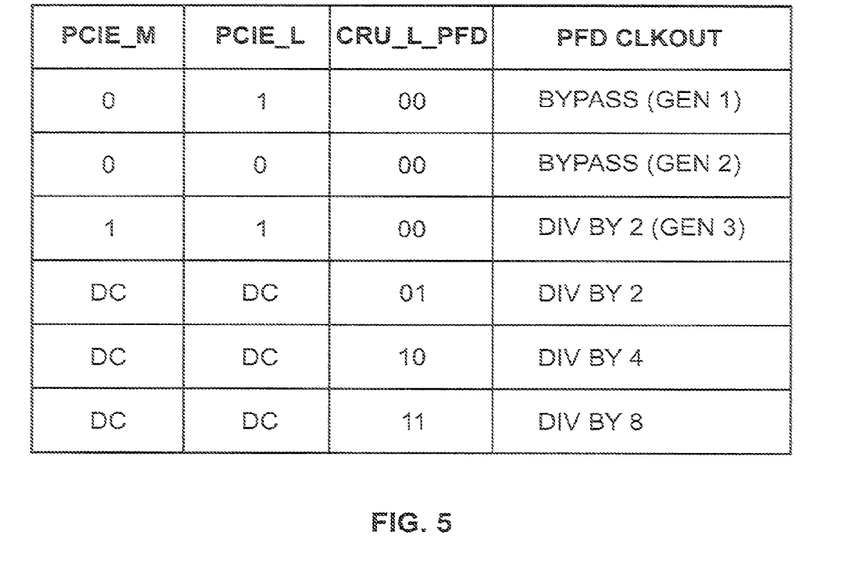
FIG. 5 is similar to FIG. 4 for certain other control signals.

For completeness, FIGS. 4 and 5 show illustrative control signal decoder logic that can be used to control the selections made by mux 44 (FIG. 4) and mux 42 (FIG. 5). This decoder logic can be implemented by selection control circuitry that is part of subsystem 40 in FIG. 1. In FIG. 4, for example, the CRU_L_PD signals can come from CRAM 110 (FIG. 3), while the PCIE_L and PCIE_M signals can be more dynamic signals from utilization/control circuitry 120. Similarly, in FIG. 5, the CRU_L_PFD signals can come from CRAM 110, while PCIE_L and PCIE_M are the same as in FIG. 4. If it is desired to use any of the PCIE communication protocols, the CRU_L_PD and CRU_L_PFD signals are all set to 0. FIG. 4 shows that (under those conditions of CFU_L_PD) the combination of PCIE_M=0 and PCIE_L=1 is decoded to cause mux 44 to select the divided-by-2 outputs of L counter 34, as is appropriate to implement PCIE Gent. FIG. 4 further shows that PCIE_M=0 and PCIE_L=0 is decoded to cause mux 44 to select the bypass (or divided-by-1) outputs of L counter 34, as in appropriate to implement PCIE Gen2. FIG. 4 still further shows that PCIE_M=1 and PCIE_L=1 is also decoded to cause mux 44 to select the bypass outputs of L counter 34, which is also appropriate to implement PCIE Gen3.

Turning now to FIG. 5, that FIG. shows that PCIE_M=0, PCIE_L=1, and CRU_L_PFD=00 is decoded to cause mux 42 to select the bypass (or divided-by-1) output of L counter 34, as is appropriate to implement PCIE Gen1. FIG. 5 further shows that PCIE_M=0, PCIE_L=0, and CRU_L_PFD=00 is also decoded to cause mux 42 to select the bypass output of L counter 34, as is appropriate to implement PCIE Gen2. FIG. 5 still further shows that PCIE_M=1, PCIE_L=1, and CRU_L_PFD=00 is decoded to cause mux 42 to select the divided-by-2 output of L counter 34, as is appropriate to implement PCIE Gen3.

In the bottom three lines of each of FIGS. 4 and 5 "DC" stands for "don't care," meaning that PCIE_M and PCIE_L are ignored when any of the CRU_L_PD and CRU_L_PFD signals include a non-zero (i.e., binary 1) value. When that occurs, the user has opted for some non-PCIE communication protocol (or at least a protocol that does not use PCIE-like conditions in CDR circuitry 10. In such cases the PCIE_M and PCIE_L signals are not used at all, and only the CRU_L_PD and CRU_L_PFD signals are decoded to control the selections made by muxes 44 and 42, respectively. For example, FIG. 4 shows that CRU_L_PD=01 is decoded to cause mux 44 to select the divided-by-2 outputs of L counter 34, CRU_L_PD=10 is decoded to cause mux 44 to select the divided-by-4 outputs of L counter 34, and CRU_L_PD=11 is decoded to cause mux 44 to select the divided-by-8 outputs of L counter 34. FIG. 5 shows that similar values of CRU_L_PFD are decoded to cause mux 42 to select similar outputs of L counter 34.

Figure 6:
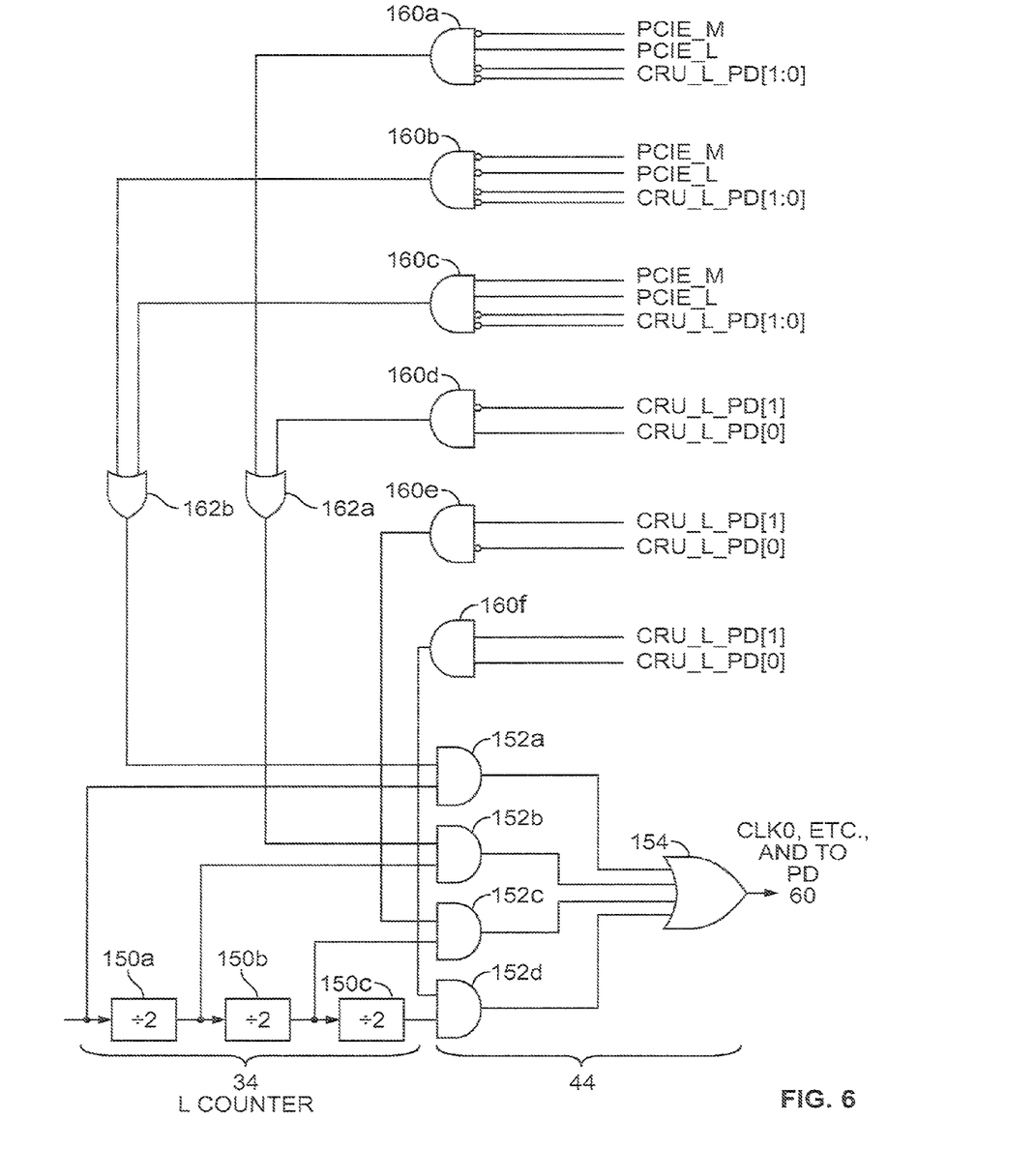
FIG. 6 is a simplified schematic block diagram of an illustrative embodiment of circuitry in accordance with certain possible aspects of the invention.
Figure 7:
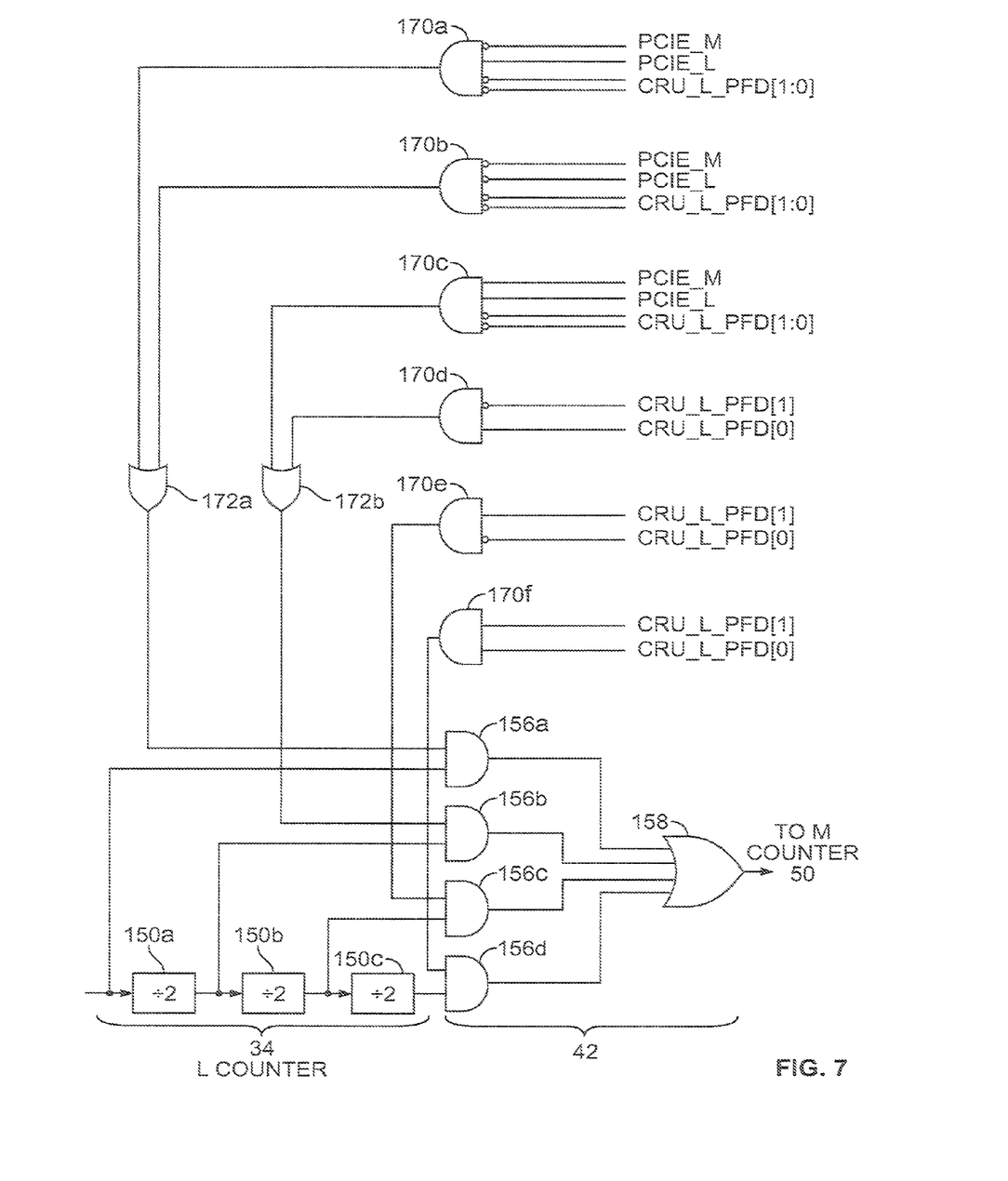
FIG. 7 is similar to FIG. 6 for certain other circuitry.

FIGS. 6 and 7 show an illustrative embodiment of logic for implementing what is shown in FIGS. 4 and 5, including illustrative construction and operation of portions of elements 34, 42, and 44. For example, FIGS. 6 and 7 both show that the L counter portion of circuitry 34 may be constructed as three, divide-by-2, frequency dividers 150a-c connected in series. (The same circuit elements 150a-c are shown in both of FIGS. 6 and 7). Each of AND gates 160a-f (in that order) implements the logic in a respective one of the horizontal rows in FIG. 4 (in order from top to bottom). (A small open circle at an AND gate input indicates logical inversion of that input as seen by the rest of the circuitry of the AND gate.) OR gate 162a logically combines the outputs of AND gates 160a and 160d (i.e., the output of OR gate 162a is asserted whenever the output of either AND gate 160a or 160d is asserted). OR gate 162b logically combines the outputs of AND gates 160b and 160c. One input to each of AND gates 152a-d is a respective one of (1) the divided-by-1 or bypass output of L counter 34, (2) the divided-by-2 output of L counter 34, (3) the divided-by-4 output of L counter 34, and (4) the divided-by-8 output of L counter 34. The other input to AND gate 152a is the output of OR gate 162b. The other input of AND gate 152b is the output of OR gate 162a. The other input to AND gate 152c is the output of AND gate 162e. The other input to AND gate 152d is the output of AND gate 162f. OR gate 154 passes on the output of whichever one of AND gates 152 is currently enabled.

FIG. 7 is similar to FIG. 6, but for what is shown in FIG. 5. Thus each of AND gates 170a-f implements the logic in a respective row in FIG. 5 (from top to bottom in both of FIGS. 5 and 7). OR gate 172a logically combines the outputs of AND gates 170a and 170b. OR gate 172b logically combines the outputs of AND gates 170c and 170d. One input to each of AND gates 156a-d is a respective one of the divided-by-1/2/4/8 outputs of L counter 34. The other inputs to AND gates 156a-d come from OR gates 172a-b or AND gates 170e-f as shown. OR gate 158 passes on the output of whichever one of AND gates 156 is currently enabled.

Figure 8:
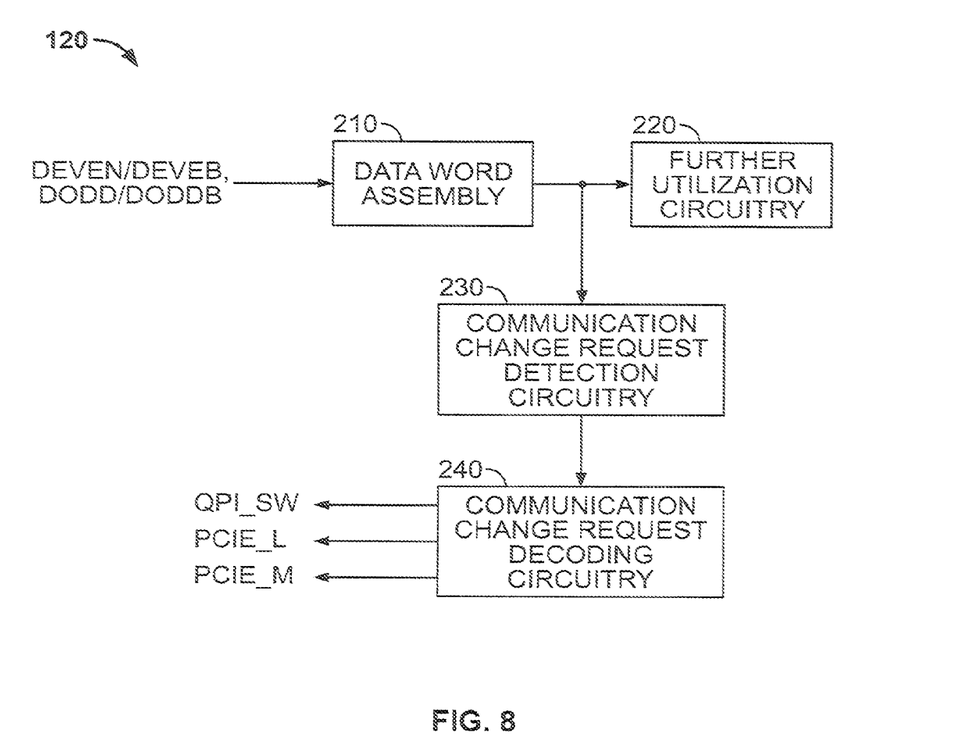
FIG. 8 is a simplified block diagram of an illustrative embodiment of still more circuitry in accordance with certain possible aspects of the invention.

FIG. 8 shows in more detail an illustrative embodiment of how utilization/control circuitry 120 may use the retimed data signal(s) (DEVEN/DEVENB, DODD/DODDB) from CDR circuitry 10, especially in an auto-speed negotiation context. As shown in FIG. 8, early processing of the retimed data includes use of circuitry 210 to identify and assemble successive data words in the retimed data. For example, this may include outputting from circuitry 210 each successive data word in parallel (rather than serial) form. This can facilitate use of the data for any desired purpose by further utilization circuitry 220 within utilization and control circuitry 120. Also within circuitry 120 is communication change request detection circuitry 230, which monitors the retimed data output by circuitry 210 for the occurrence of a communication change request (in the retimed data). For example, such a communication change request can occur as part of an auto-speed negotiation, e.g., when the other system component that is sending RXP/RXN to IC 100 wants to change the speed (data rate) of that communication. The other system component then includes in the RXP/RXN data stream communication change request data. Circuitry 230 detects this change request data downstream from CDR 10, and circuitry 230 then passes that communication change request on to communication change request decoding circuitry 240. Circuitry 240 decodes the communication change that has been requested and outputs the values of control signals like QPI_SW, PCIE_L, and PCIE_M that are appropriate to change the operation(s) of CDR 10 to support the requested new communication mode (especially the new communication speed). Other ancillary signals may also be needed from (and therefore produced by) circuitry 240 (e.g., to cause CDR 10 to temporarily switch back to use of its reference clock loop until begin using its data loop for the new communication mode.

To briefly recapitulate some of the foregoing, for PCIE auto-speed negotiation (as an example), the values of the dynamic signals PCIE_M and PCIE_L automatically change in response to a communication change request received via RXP/RXN, CDR 10, etc. This can change the L counter output selection settings in PD and PFD mux circuitries 44 and 42. This automatic counter-selection-setting change automatically allows CDR 10 to relock to a different data rate. The invention similarly allows for auto speed negotiation in other communication protocols such as QPI (in which the data rate can change between 3.2 Gbps and 6.4 Gbps as shown in rows 7 and 8 in FIG. 2).

We turn now to some other possible aspects of the invention.

Just as there is a need to support wider ranges of data rates for incoming (received) serial data signals, there is a similar need for wider ranges of outgoing (transmitted) serial data signal bit rates. Such a transmitted serial data signal may be clocked by so-called transmitter phase-locked loop ("TX-PLL") circuitry. TXPLL circuitry with a wide bandwidth is helpful to support a wide range of TX bit rates.

Figure 9:
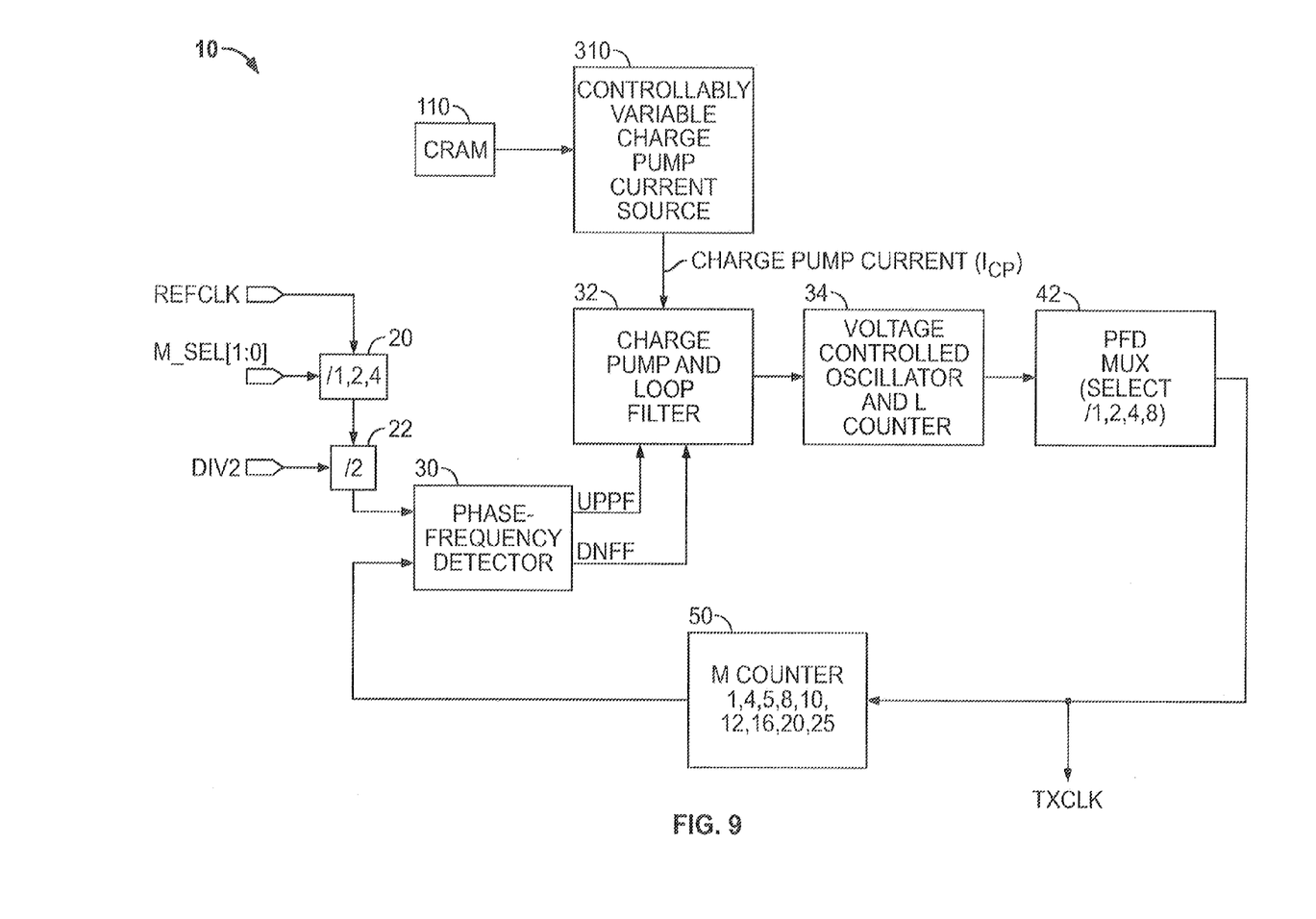
FIG. 9 is a simplified schematic block diagram of an illustrative embodiment of further circuitry in accordance with certain further possible aspects of the invention.

The TXPLL can be a subset of CDR circuitry, e.g., as described earlier in this specification. FIG. 9 shows an illustrative embodiment of such a TXPLL (as a subset of earlier-described CDR 10). Elements in FIG. 9 that are the same as in FIG. 1 have the same reference numbers in both FIGS., and in general these common elements do not need to be described again. Reference number 10 is used again in FIG. 9 as a general reference number, this time for the TXPLL. FIG. 9 shows at TXCLK where the TXPLL circuitry may be tapped to provide a signal (TXCLK) for clocking serial data out of the transmitter circuitry.

PLL bandwidth is a direct function of VCO gain ("Kvco" in the following expression), charge pump current ("Icp" in the following expression), loop filter threshold setting ("R" in the following expression), and M counter setting ("M" in the following expression). (VCO gain is the slope of a plot of VCO output frequency vs. VCO control voltage.) As a useful approximation, PLL bandwidth ("BW") is proportional to Kvco*Icp*R/M.

A transceiver specification that is often very stringent is a requirement for low transmitter jitter (also called random jitter or RJ). For example, at high data rates the allowed maximum jitter at the transmitter (which is a function of TXPLL jitter) may be less than 1.4 pico-seconds ("ps"). Increasing TXPLL bandwidth in accordance with the present invention tends to suppress internal PLL noise, which in turn tends to reduce jitter at the PLL output. (Conversely, decreased PLL BW helps to suppress noise in the reference clock ("REFCLK") signal that the PLL uses. But REFCLK signals tend to be very "clean" (i.e., free of noise), and that is assumed to be true in this discussion.)

Figure 10:
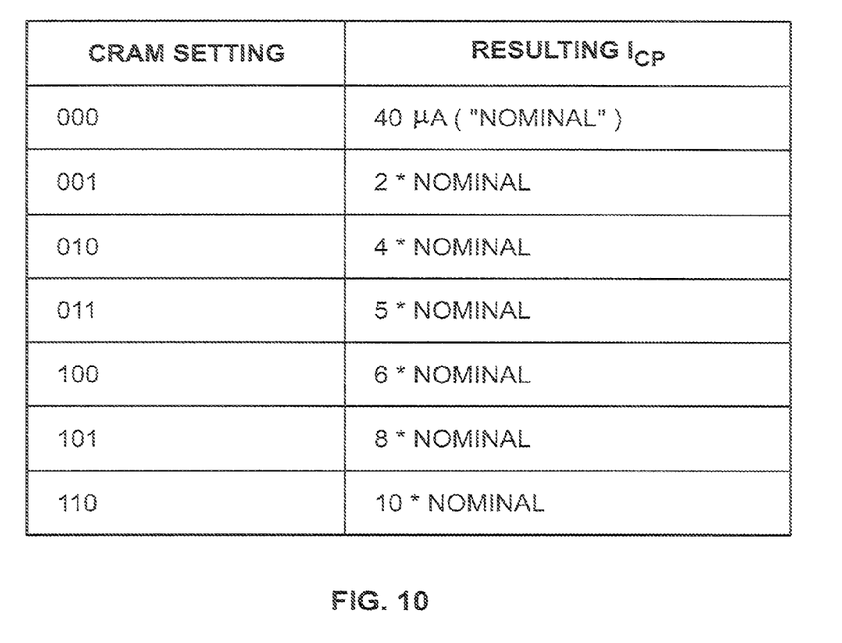
FIG. 10 is a chart showing an illustrative mode of operating circuitry of the type shown in FIG. 9 in accordance with certain possible aspects of the invention.

In accordance with the present invention, PLL bandwidth is increased (especially for TXPLL applications as in FIG. 9) by carefully (controllably) increasing charge pump current (Icp) as used in charge pump circuitry 32 by any of several selectable multiples of a nominal value when high BW is required. Illustrative circuitry for doing this is shown in FIG. 9, and further illustrated by FIG. 10. As shown in FIG. 9, PLL (especially TXPLL) circuitry 10 may be augmented by controllably variable charge pump current source circuitry 310. Circuitry 310 supplies the charge pump current (Icp) used by charge pump 32. The amount of Icp that circuitry 310 supplies may be controlled by CRAM elements 110 (e.g., portions of CRAM 110 in FIG. 3). An example of the various values of Icp that circuitry 310 may supply in response to various values of several (three) CRAM bits is shown in FIG. 10. For example, Icp may have a so-called "nominal" value of 40 micro-amps when the relevant CRAM setting is 000. Changing the CRAM setting to 001 causes Icp to double (i.e., to twice the nominal value, or 80 micro-amps). Changing the CRAM setting to 010 causes Icp to become four times the nominal value. Other CRAM settings shown in FIG. 10 produce other multiples of nominal Icp, up to an illustrative maximum of 10 times 40 micro-amps (or 400 micro-amps). The expression for PLL bandwidth provided earlier in this specification demonstrates that increasing Icp increases such bandwidth. Such controllable Icp increase/decrease is preferably employed in current sources in both the UP and DOWN portions of charge pump 32.

Figure 11:
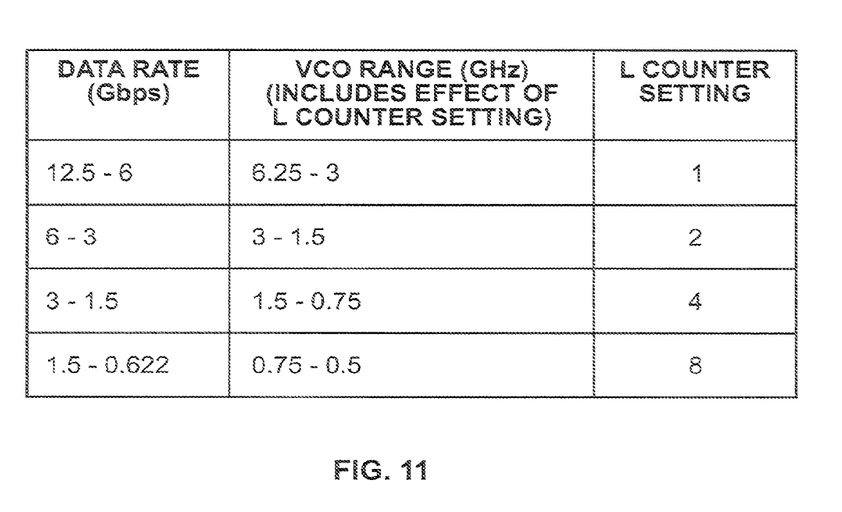
FIG. 11 is a chart showing illustrative examples of various values of certain circuit operating parameters in accordance with certain possible aspects of the invention.

In accordance with other possible aspects of the invention (which may be of interest for either the receiver or transmitter circuitry on an IC), the frequency range of VCO 34 may be extended for a wide continuous range of, for example, 1 GHz to 6.25 GHz. Thus VCO 34 has what may be referred to as a "single gear," which supports frequencies from 1 GHz to 6.25 GHz by itself. The L counter (also part of element 34) is added after the VCO to extend the frequency range farther. The L counter can be set to let the VCO operate at a convenient frequency for any data rate within a very wide and continuous (i.e., no gaps or holes) range of data rates. This point is illustrated by FIG. 11. In particular, FIG. 11 shows that any data rate can be supported within a range from 0.622 Gbps to 12.5 Gbps. This is a range that extends between lower and upper limits separated by a scale factor of more than 20 (i.e., 12.5 Gbps is more than 20 times 0.622 Gbps). Moreover, this entire range is supported (i.e., support is continuous, with no gaps of unsupported data rates anywhere in the range).

In accordance with still other possible aspects of the invention, the architecture of the CDR circuitry may include controllably variable voltage regulator output voltage for charge pump circuitry 32. This can be used, for example, to support sorting ICs into different speed grade categories. (Although all of the ICs may be intended to be able to support the same operating speeds, as actually manufactured some may be able to operate faster than others. The faster ICs can be given a higher speed grade and sold at a higher price than the slower ICs, which must be given a lower speed grade and a lower selling price.)

As an illustration of the foregoing, the power supply 320 (FIG. 12) used for the charge pump voltage regulator 330 may be a 3.0V power supply. (Note that unlike at least most other circuit elements depicted in the various FIGS. that form part of this disclosure, power supply 320 may not (at least not at its ultimate source) be part of the circuitry of the IC that includes the other depicted circuit elements. Of course, the IC typically does include at least terminals and conductors for conveying power from the ultimate external source to power-using circuitry on the IC, so those terminals and conductors may sometimes be referred to as "power supply circuitry." Also note that FIG. 12 has been greatly simplified by omitting depiction of other elements of the loop circuitry (as in FIGS. 1 and 9) that circuit element 32 is part of.) With such a power supply 320, the charge pump voltage regulator 330 may produce a nominal, regulated, output voltage of 1.8V, which provides power supply for the core circuitry of charge pump and loop filter circuitry 32. (The just-referenced "core circuitry" typically includes the analog parts of the charge pump circuitry and the loop filter circuitry.)

Figure 12:
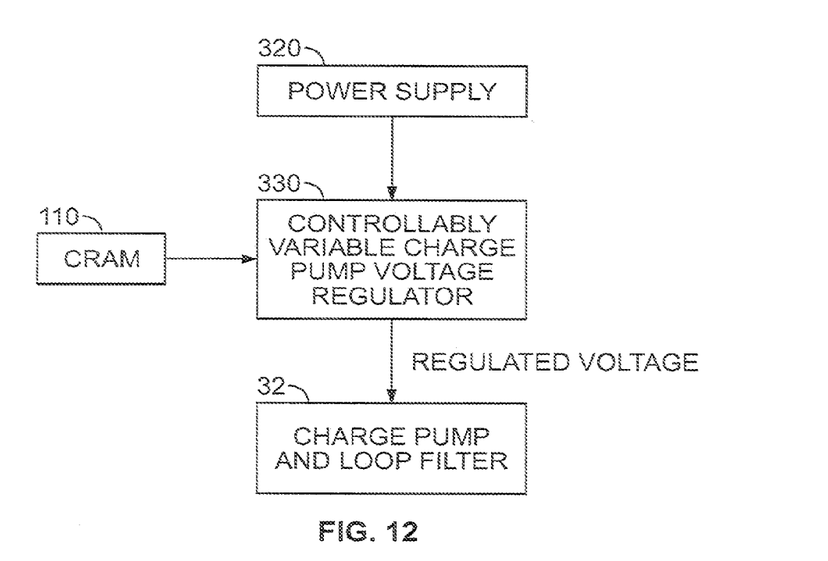
FIG. 12 is a simplified block diagram of an illustrative embodiment of still more circuitry in accordance with still more possible aspects of the invention.

In accordance with the present invention, voltage regulator 330 may have controllably variable output (regulated) voltage. For example, in the illustrative case mentioned above, the regulated output voltage can be 1.8 V, or it can be boosted up from that nominal voltage (e.g., by any one of several different amounts to a maximum which can be, e.g., 50% above the nominal amount) to support higher speed operation.

Higher possible charge pump regulator voltage provides wider charge pump dynamic voltage range, helping to support high-speed operation.

For low-speed operation, power supply 320 can be reduced (e.g., from 3.0V to 2.5V) to save power.

The digital power supply (not shown, but used for digital parts of the circuitry of the IC) can also be reduced (e.g., from 1.0V to 0.85V) to save power. When the power supply 320 for charge pump regulator 330 is reduced, the regulated output voltage of element 330 is also reduced. But in accordance with this invention, there is an option for boosting the regulated voltage even when power supply 320 with low voltage is employed. Charge pump regulator 330 can provide high output voltage using, e.g., programmably controlled (by CRAM 110) boosting. As a result, even with a 2.5V power supply 320 for regulator 330, the circuitry can provide a wide output (regulated) voltage, and consequently a wide charge pump 32 dynamic voltage to generate greater than 6 GHz VCO 34 output.

Figure 13:
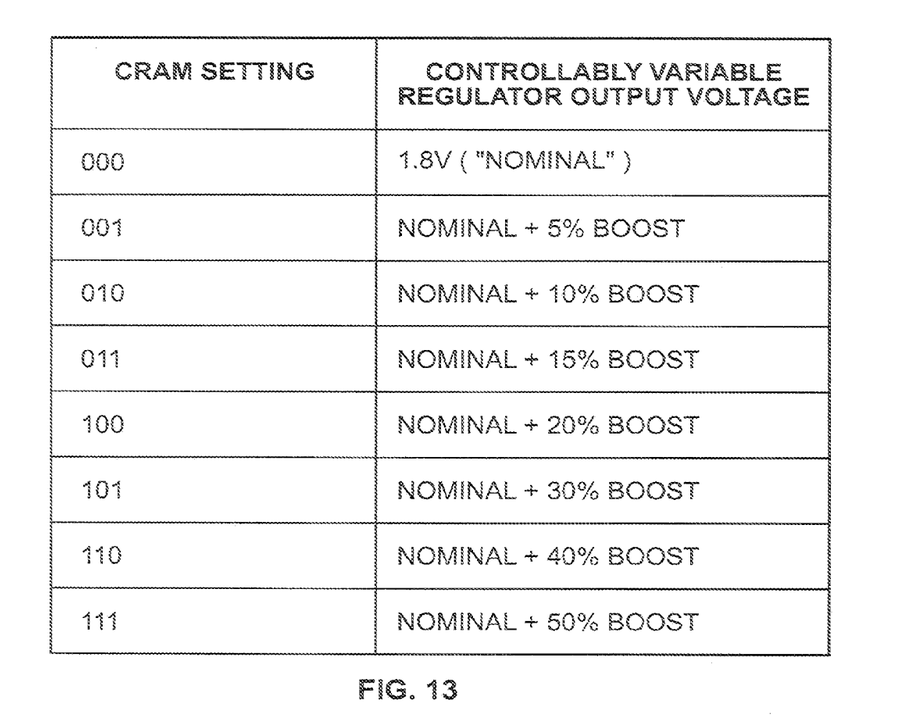
FIG. 13 is a chart showing an illustrative example of how circuitry of the type shown in FIG. 12 may operate in accordance with possible aspects of the invention.

FIG. 13 shows an example of how the values output by several CRAM 110 elements may determine which one of several selectable values of regulated voltage boost may be implemented by regulator 330.

It will be understood that the foregoing is only illustrative of the principles of the invention, and that various modifications can be made by those skilled in the art without departing from the scope and spirit of the invention. For example, the various inventive aspects that have been discussed herein can either all be used together in certain embodiments, or other embodiments may employ only one or more (but less than all) of the inventive aspects. And if multiple (but less than all) of the inventive aspects are employed, that can involve employment of any combination of the inventive aspects. As another example of possible modifications, throughout this disclosure, particular parameter values are mentioned. In most cases these particular values are only examples, and other suitable parameter values can be used instead if desired.

What is claimed is:

1. An integrated circuit ("IC") comprising:
   phase-locked loop ("PLL") circuitry including charge pump circuitry, voltage-controlled oscillator circuitry, and phase-frequency detector circuitry coupled to one another in a closed loop series; and
   circuitry for supplying a controllably variable amount of charge pump current to the charge pump circuitry, wherein the charge pump circuitry and the voltage-controlled oscillator circuitry are used in a data loop to generate a recovered data signal and wherein the voltage-controlled oscillator circuitry is controllable to change a frequency of the voltage-controlled oscillator circuitry based on data in the recovered data signal.

2. The integrated circuit defined in claim 1 further comprising:
   programmable circuitry for controlling the circuitry for supplying to determine the amount of charge pump current the circuitry for supplying supplies to the charge pump circuitry.

3. The integrated circuit defined in claim 1 wherein the circuitry for supplying supplies a controllable number of multiples of a nominal amount of charge pump current to the charge pump circuitry.

4. The integrated circuit defined in claim 1 wherein the data loop includes phase detector circuitry that outputs the recovered data signal, and wherein the voltage-controlled oscillator circuitry is controllable based on data in the recovered data signal to facilitate auto-speed negotiation.

5. An integrated circuit ("IC") comprising:
   phase-locked loop circuitry including charge pump circuitry, voltage-controlled oscillator circuitry, and phase-frequency detector circuitry coupled to one another in a closed loop series, and
   controllably variable voltage regulator circuitry for supplying a regulated voltage to the charge pump circuitry, the regulated voltage being controllably variable, wherein the charge pump circuitry and the voltage-controlled oscillator circuitry are used in a data loop to generate a recovered data signal and wherein the voltage-controlled oscillator circuitry is controllable based on data in the recovered data signal, wherein the data loop includes phase detector circuitry that outputs the recovered data signal.

6. The integrated circuit defined in claim 5 further comprising:
   power supply circuitry for supplying a power supply signal having a power supply voltage to the controllably variable regulator circuitry, the controllably variable regulator circuitry being able to controllably vary the regulated voltage relative to the power supply voltage.

7. The integrated circuit defined in claim 5 further comprising:
   programmable circuit elements for controlling the regulated voltage supplied by the controllably variable voltage regulator circuitry.

* * * * *